(12) United States Patent
Ueno (10) Patent No.: US 6,303,947 B1
(45) Date of Patent: Oct. 16, 2001

(54) SILICON CARBIDE VERTICAL FET AND METHOD FOR MANUFACTURING THE SAME

(75) Inventor: Katsunori Ueno, Nagano (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 09/487,169

(22) Filed: Jan. 19, 2000

(30) Foreign Application Priority Data

Jan. 20, 1999 (JP) .................................................. 11-011601

(51) Int. Cl.[7] .............................................. H01L 31/0312
(52) U.S. Cl. ............................ 257/77; 257/279; 257/281
(58) Field of Search ........................... 257/279, 77, 281, 257/289; 438/105, 268, 931, 570

(56) References Cited

U.S. PATENT DOCUMENTS

| 5,877,047 | * | 3/1999 | Weitzel | 438/173 |
| 5,895,939 | * | 4/1999 | Ueno | 257/279 |
| 5,917,203 | * | 6/1999 | Bhatnagar | 257/139 |
| 6,117,735 | * | 9/2000 | Ueno | 438/268 |

FOREIGN PATENT DOCUMENTS

| 401289163-A | * | 11/1989 | (JP) . |
| 405259443-A | * | 4/1992 | (JP) . |

* cited by examiner

*Primary Examiner*—Olik Chaudhuri
*Assistant Examiner*—Nathan W. Ha
(74) *Attorney, Agent, or Firm*—Rossi & Associates (57) ABSTRACT

A silicon carbide vertical field-effect transistor is provided wherein a first conductivity type drift layer formed of silicon carbide is laminated on a first conductivity type silicon carbide drain layer, and a second conductivity type gate region and a first conductivity type source region are formed in selected portions of a surface layer of the first conductivity type drift layer, such that the gate and source regions are spaced from each other, while a second conductivity type embedded region is formed in a selected portion of the drift layer below the gate region and source region, such that the embedded region is not connected to the source region. A second conductivity type contact region that is in contact with the embedded region is short-circuited to a gate electrode that is formed on the gate region, so that the potential of the embedded region is made equal to that of the gate region. A method for manufacturing such a silicon carbide vertical FET is also disclosed.

12 Claims, 6 Drawing Sheets

SILICON CARBIDE VERTICAL FET AND METHOD FOR MANUFACTURING THE SAME

FIELD OF THE INVENTION

The present invention relates to field-effect transistors (hereinafter referred to as FET), in particular, junction-type FET (hereinafter referred to as JFET) and metal-semiconductor junction type FET (hereinafter referred to as MESFET), which use silicon carbide as a semiconductor material and are highly expected to be used as power semiconductor devices, and also relates to a method for manufacturing such field-effect transistors.

BACKGROUND OF THE INVENTION

Silicon carbide (that will be referred to as SiC) has a wide band gap, and its maximum breakdown electric field is larger than that of silicon by one order of magnitude. Thus, SiC has been highly expected to be used as a material for power semiconductor devices in the next generation. Up to the present, various types of electron devices, in particular, those for switching large power at high temperatures, have been developed, using single-crystal wafers, such as 4H—SiC and 6H—SiC. These crystals are alpha-phase SiC in which a zinc-blend structure and a wurtzite structure are superposed on each other. Also, semiconductor devices have been fabricated using crystals of beta-phase SiC, such as 3C—SiC.

Recently, power devices, such as Schottky diodes, vertical MOSFET and thyristors, and CMOS-IC as the most popular semiconductor devices, have been fabricated using SiC as a semiconductor material, and it has been confirmed that these devices exhibit far better characteristics than conventional Si semiconductor devices.

Figure 9:
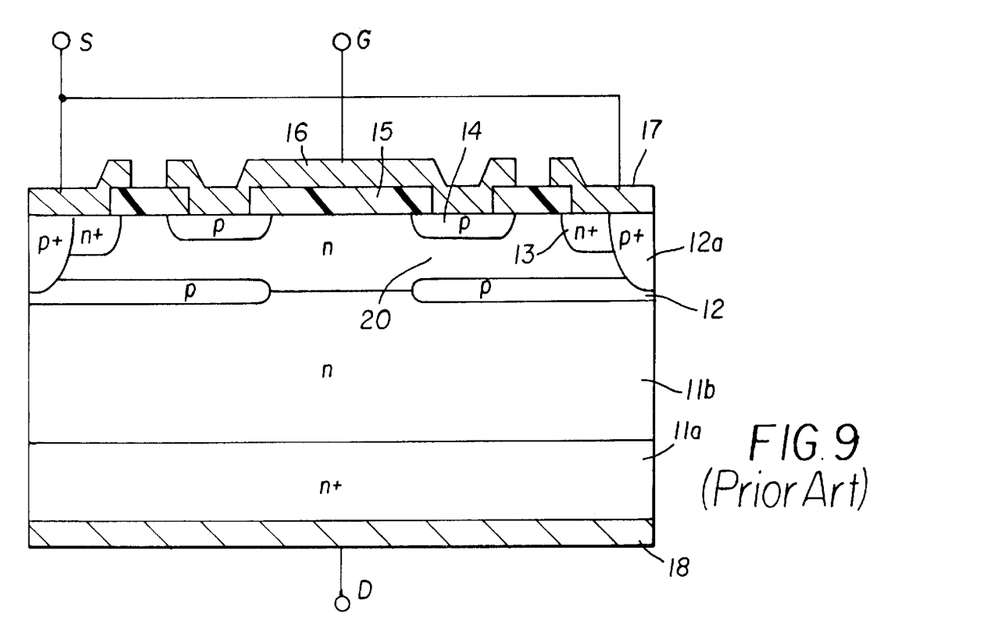
FIG. 9 is a cross-sectional view showing a known example of JFET.

FIG. 9 is a cross-sectional view showing one example of power JFET that has been reported. In the JFET of FIG. 9, an n drift layer 11$b$ is laminated on an n$^+$ drain layer 11$a$, and a p$^+$ embedded region 12 is formed in the n drift layer 11$b$ by implanting ions at a high accelerating-field voltage. An n channel region 20 is formed by introducing n-type impurities into the n drift layer 11$b$ located above the p$^+$ embedded region 12, and p gate region 14 and n$^+$ source region 13 are formed in a surface layer of the n channel region 20. A source electrode 17 is formed in contact with the n$^+$ source region 13, and a drain electrode 18 is formed in contact with the n$^+$ drain layer 11$a$, while a gate electrode 16 is formed in contact with the p gate region 14. A gate insulating film 15 is formed on the surface of the n channel region 20 interposed between two n$^+$ source regions 13, and cooperates with the gate electrode 16 to provide a MOS gate. The source electrode 17 is in contact with not only the n$^+$ source region 13 but also a p$^+$ contact region 12$a$ that is in contact with the p$^+$ embedded region 12.

The n channel region 20 is interposed between the p$^+$ embedded region 12 and the p gate region 14. When a positive voltage is applied to the gate electrode 16, an accumulation layer in which carriers are accumulated is induced in a portion of the n channel region 20 located below the gate insulating film 15, thus allowing current to flow from the drain electrode 18 to the source electrode 17. When a negative voltage is applied to the gate electrode 16, a depletion layer spreads out from the p gate region 14 into the n channel region 20, thereby to narrow a conduction region of the n channel region 20, and thus control current flow between the source electrode 17 and the drain electrode 18. Thus, the JFET of FIG. 9 is capable of switching current between the source and the drain, with a positive or negative voltage applied to the gate electrode 16.

While the JFET having the structure of FIG. 9 exhibits mostly favorable characteristics, it still needs to be improved in the following two aspects.

Firstly, there is always a demand for an increase in the gain with respect to gate voltage. Secondly, if the potential of the p gate region 14 becomes lower than that of the p$^+$ embedded region 12, holes or current flow from the p$^+$ embedded region 12 into the p gate region 14. As a result, the device tends to be turned on by mistake.

In the JFET of FIG. 9, the impurity concentration is controlled by, for example, implanting ions over the entire area of the n channel region 20, for the purpose of controlling switching characteristics. In this case, however, the n channel region 20 may affect spreading of a depletion layer between the p gate region 14 and the n drift layer 12, thus limiting control of the breakdown voltage.

SUMMARY OF THE INVENTION

It is therefore an object of the present invention to provide a silicon carbide vertical FET which provides a high breakdown voltage and a large gain with respect to gate voltage, and which operates with high stability.

To accomplish the above object, the present invention provides a silicon carbide vertical FET which comprises a first conductivity type silicon carbide drain layer; a first conductivity type drift layer comprising silicon carbide, which is laminated on the first conductivity type silicon carbide drain layer; a second conductivity type gate region and a first conductivity type source region that are formed in selected portions of a surface layer of the first conductivity type drift layer, such that the gate region and the source region are spaced from each other; a second conductivity type embedded region formed in a selected portion of the first conductivity type drift layer below the second conductivity type gate region and the first conductivity type source region, such that the embedded region is not connected to the gate region and the source region; a gate electrode formed in contact with a surface of the second conductivity type gate region; a source electrode formed in contact with a surface of the first conductivity type source region; and a drain electrode formed on a rear surface of the first conductivity type drain layer, wherein the second conductivity type embedded region has the same potential as the gate electrode.

More specifically, a second conductivity type contact region may be formed which extends from the surface of the first conductivity type drift layer to reach the second conductivity type embedded region, and a contact electrode that contacts with the surface of the second conductivity type contact region may be connected to the gate electrode. Alternatively, a recess may be formed in the first conductivity type drift layer such that the recess extends from the surface of the first conductivity type drift layer to reach the second conductivity type embedded region, and an embedded electrode received in the recess for contact with an exposed surface of the second conductivity type embedded region may be connected to the gate electrode.

In the silicon carbide vertical FET fabricated by the above-described methods, depletion layers spread out from both the second conductivity type embedded region and second conductivity type gate region into the first conductivity type drift layer located above the second conductivity type embedded region, resulting in a significantly improved gain with respect to gate voltage. Since the second conductivity type embedded region and the second conductivity type gate region have the same potential, no parasitic transistor appears between the embedded region and the gate region, and no current flows between these regions. Thus, the present FET is free from faulty operations due to current that would otherwise flow between the embedded region and the gate region.

In the silicon carbide vertical FET, the second conductivity type gate region may be formed in a surface layer of the first conductivity type drift layer that is located above a portion where the second conductivity type embedded region is not formed. In another form of the invention, the gate electrode is formed on a gate insulating film over a surface layer of the first conductivity type drift layer that is located above a portion where the second conductivity type embedded region is not formed. In a further form of the invention, a metal film that forms a Schottky junction with the first conductivity type drift layer is formed on a surface of the first conductivity type drift layer that is located above a portion where the second conductivity type embedded region is not formed.

The present invention also provides a silicon carbide vertical FET in which a second conductivity type gate region is not provided, and which includes a gate electrode that is formed in contact with the surface of a first conductivity type drift layer and forms a Schottky junction with the drift layer, a source electrode formed in contact with a first conductivity type source region, and a drain electrode formed in the rear surface of a first conductivity type drain layer. In the silicon carbide vertical FET, the potential of a second conductivity type embedded region is made equal to that of the gate electrode.

In the silicon carbide vertical FET as described above, depletion layers spread out from both the second conductivity type embedded region and the gate electrode that forms a Schottky junction, into the first conductivity type drift layer located above the second conductivity type embedded region, resulting in a significantly improved gain with respect to gate voltage.

The silicon carbide vertical FET may further include a first conductivity type channel region that is formed in a surface layer of the first conductivity type drift layer and has a higher impurity concentration than the first conductivity type drift layer. In this case, the threshold voltage can be controlled by controlling the impurity concentration of the first conductivity type channel region. Also, the silicon carbide vertical FET may operates as a normally-off type FET.

According to a further aspect of the present invention, there is provided a silicon carbide vertical FET, which comprises: a first conductivity type silicon carbide drain layer; a first conductivity type drift layer comprising silicon carbide, which is laminated on the first conductivity type silicon carbide drain layer; a second conductivity type gate region and a first conductivity type source region that are formed in selected portions of a surface layer of the first conductivity type drift layer, such that the gate region and the source region are spaced from each other; a first conductivity type channel region formed in the surface layer of the first conductivity type drift layer, the first conductivity type channel region having a higher impurity concentration than the first conductivity type drift layer; a second conductivity type embedded region formed in a selected portion of the first conductivity type drift layer below the second conductivity type gate region and the first conductivity type source region, such that the embedded region is not connected to the gate region and the source region; a gate electrode formed in contact with a surface of the second conductivity type gate region; a source electrode formed in contact with a surface of the first conductivity type source region; and a drain electrode formed on a rear surface of the first conductivity type drain layer, wherein the first conductivity type channel region is formed in a selected portion of the first conductivity type drift layer.

In the known structure as discussed above, impurities are introduced over the entire area of the semiconductor substrate in order to control channel characteristics such as a threshold voltage, and therefore the breakdown voltage may be undesirably reduced at a portion where the impurity region overlaps with another impurity region. Selective introduction of impurities according to the above aspect of the invention makes it possible to suitably control channel characteristics and also achieve a desired breakdown voltage.

For example, the first conductivity type channel region may be present only above the second conductivity type embedded region, so that the device is free from influences of end portions of the second conductivity type embedded region.

As a method for manufacturing the silicon carbide vertical FET as described above, the first conductivity type source region, the second conductivity type gate region and the second conductivity type embedded region may be respectively formed using a first mask including a first portion and a second portion, such that one end of the first conductivity type source region is defined by one of opposite ends of the first portion of the first mask, and the second conductivity type gate region is defined by the other end of the first portion of the first mask, and the second portion of the first mask, while an end of the second conductivity type embedded portion is defined by the second portion of the first mask.

As another method for manufacturing a silicon carbide vertical FET, the first conductivity type source region and the second conductivity type embedded region may be respectively formed using a first mask including a first portion and a second portion, such that one end of the first conductivity type source region is defined by one of opposite ends of the first portion of the first mask, and an end of the second conductivity type embedded portion is defined by the second portion of the first mask.

A specific example of process for manufacturing a silicon carbide vertical FET includes the steps of: preparing a silicon carbide substrate by epitaxially growing a first conductivity type drift layer comprising silicon carbide, on a first conductivity type silicon carbide drain layer; forming a first mask on a surface of the first conductivity type drift layer; forming a second mask made of a different material from that of the first mask, such that the second mask overlaps the first mask; introducing impurities so as to form a first conductivity type source region in a selected portion of a surface layer of the first conductivity type drift layer, using the first mask and the second mask; removing the second mask; forming a third mask made of a different material from that of the first mask, such that the third mask overlaps the first mask; introducing impurities so as to form a second conductivity type gate region in a selected portion of a surface layer of the first conductivity type drift layer, using the first mask and the third mask; removing a first portion of the first mask and the third mask while leaving a second portion of the first mask; introducing impurities so as to form a second conductivity type embedded region in a selected portion of the surface layer of the first conductivity type drift layer, using the second portion of the first mask; removing the second portion of the first mask; conducting heat treatment for activating the introduced impurities; forming a fourth mask on a surface of the silicon carbide substrate; forming a recess that extends from the surface of the first conductivity type drift layer to reach the second conductivity type embedded region, using the fourth mask; forming a fifth mask comprising an insulating material; vapor-depositing a metal film; and forming a gate electrode, a source electrode and a drain electrode from the metal film.

With the above-described method, the substantial dimensions of the channel region are determined by the first conductivity type source region and second conductivity type embedded layer that are formed using the first mask, and therefore the channel length can be controlled with high accuracy, without suffering from non-uniformity that would be otherwise caused by misalignment of masks. It is thus possible to produce a FET having small ON resistance.

In particular, the impurities for forming the first conductivity type source region and the second conductivity type embedded region may be introduced by implanting ions into selected portions of the first conductivity type drift layer. Thus, the impurity regions can be surely formed even in the SiC substrate.

BRIEF DESCRIPTION OF THE DRAWINGS

The invention will be described in greater detail with reference to preferred embodiments thereof and the accompanying drawings, wherein:

FIG. 2(a) through FIG. 2(f) are cross-sectional views showing process steps for manufacturing the JFET of the first embodiment of FIG. 1;

FIG. 3(a) through FIG. 3(d) are cross-sectional views showing process steps following the step of FIG. 2(f) in the manufacture of the JFET of the first embodiment;

DETAILED DESCRIPTION OF THE PREFERRED EMBODIMENTS

Some embodiments of the present invention will be described in detail, though no description will be provided with respect to such portions that are identical with those of the known example of FIG. 9, or not related to the present invention. While n channel FETs will be illustrated as important applications of the present invention, it is to be understood that this invention is equally applicable to p channel FETs having the opposite conductivity types. While numerous polytypes of silicon carbide are available, 6H—SiC or 4H—SiC is mainly employed in the following embodiments.

First Embodiment

Figure 1:
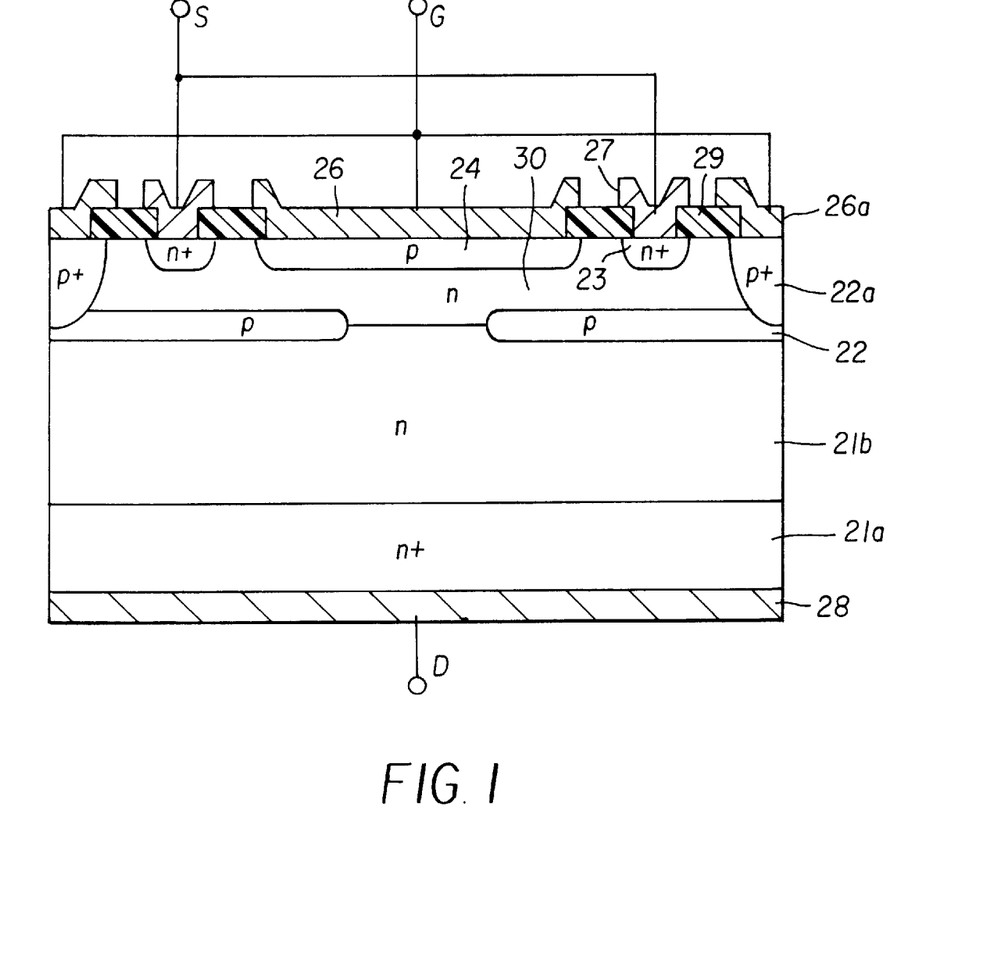
FIG. 1 is a cross-sectional view showing a JFET according to the first embodiment of the present invention.

FIG. 1 is a cross-sectional view of a unit cell of SiC JFET according to the first embodiment of the present invention.

In the SiC JFET of FIG. 1, an n drift layer 21b is epitaxially grown on an n$^+$ drain layer 21a, to provide a wafer in which a p$^+$ embedded region 22 is formed over a selected area at a location that is spaced a small distance from the top surface of the n drift layer 21b, and an n channel region 30 having a higher donor concentration than the n drift layer 21b lies above the p$^+$ embedded region 22. A p gate region 24, n$^+$ source region 23, and a p$^+$ contact region 22a that reaches the p$^+$ embedded region 22 are formed in a surface layer of the n channel region 30 such that these regions 24, 23, and 22a are isolated from each other. A gate electrode 26 is formed on the surface of the p gate region 24, and a source electrode 27 is formed on the surface of the n$^+$ source region 23, while a contact electrode 26a is formed on the surface of the p$^+$ contact region 22a. Also, a drain electrode 28 is formed in contact with the rear surface of the n$^+$ drain layer 21a. The contact electrode 26a is short-circuited to the gate electrode 26. While each electrode is generally formed of a metal such as titanium (Ti), aluminum (Al), and alloys thereof, for ohmic contact with a p type region, or formed of a metal, such as nickel (Ni), for ohmic contact with an n type region, any metal may be used to provide ohmic contact if the surface concentration of the p type region or n type region is $1 \times 10^{19}$ cm$^{-3}$. In FIG. 1, reference numeral 29 denotes an insulating film.

The dimensions of the respective layers or regions of the device may be determined as follows. The n$^+$ drain layer 21a has an impurity concentration of $1 \times 10^{18}$ cm$^{-3}$ and a thickness of 350 $\mu$m, and the n drift layer 21b has an impurity concentration of $1 \times 10^{16}$ cm$^{-3}$ and a thickness of 9 $\mu$m. The p$^+$ embedded region 22 has the maximum impurity concentration of $1 \times 10^{19}$ cm$^{-3}$ and a thickness of 0.3 $\mu$m, and the n channel region 30 located above the p$^+$ embedded region 22 has a thickness of 0.8 $\mu$m. Adjacent p$^+$ embedded regions 22 are spaced about 5 $\mu$m from each other. The n$^+$ source region 23 has an impurity concentration of $1 \times 10^{19}$ cm$^{-3}$, a junction depth of 0.2 $\mu$m, and a width of about 3 $\mu$m. The p gate region 24 has an impurity concentration of $1 \times 10^{19}$ cm$^{-3}$, a junction depth of 0.2 $\mu$m, and a width of about 10 $\mu$m. The p$^+$ contact region 22a has an impurity concentration of $1 \times 10^{19}$ cm$^{-3}$, a junction depth of 1.0 $\mu$m, and a width of about 3 $\mu$m. The spacing between the n$^+$ source region 23 and the p gate region 24 is about 1 $\mu$m. The pitch of unit cells as shown in FIG. 1 is about 25 $\mu$m.

The JFET of the present embodiment is different from that of FIG. 9 in that the n$^+$ source region 23 and p$^+$ contact region 22a are isolated or separated from each other, and therefore the source electrode 27 is not in contact with the p$^+$ embedded region 22. The p$^+$ embedded region 22 has the same potential as the p gate region 24 that is connected to the region 22 via the p$^+$ contact region 22a. While the p gate region 24 extends over a relatively wide area of the substrate surface in the present embodiment, this arrangement provides one form of JFET, and operates in substantially the same manner as the JFET of FIG. 9.

FIG. 2(a) through FIG. 2(f) and FIG. 3(a) through FIG. 3(d) are cross-sectional views showing the vicinity of the surface of the semiconductor substrate in the order of manufacturing steps, which views are useful in explaining a method for manufacturing the SiC JFET of the first embodiment of FIG. 1.

Figure 2A:
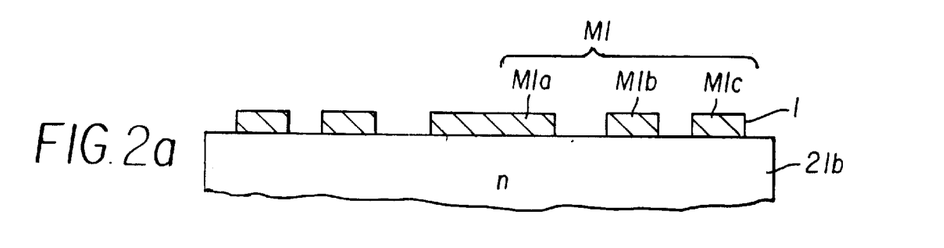

Initially, the n drift layer 21b doped with phosphorous is epitaxially grown on the n$^+$ drain layer 21b, to provide a 4H—SiC substrate. For example, the n drift layer 21b has an impurity concentration of $1 \times 10^{16}$ cm$^{-3}$ and a thickness of 10 $\mu$m. A polycrystalline silicon or polysilicon film 1 is deposited on the surface of the n drift layer 21b by reducedpressure CVD, and formed into a certain pattern by photolithography, to provide a first mask M1, as shown in FIG. 2(a). The first mask M1 consists of a center portion M1a and opposite side portions M1b, M1c. The thickness of the polysilicon film is 1 μm. The first mask M1 is not necessarily formed from the polysilicon film, but may consist of a silicon dioxide film (that will be referred to as $SiO_2$ film) often used in silicon process, or silicon nitride film, or photoresist, provided that the mask permits selective etching. Where ion implantation is conducted at a high temperature, the mask needs to be formed of a material, such as polysilicon, that withstands the high temperature.

Figure 2B:
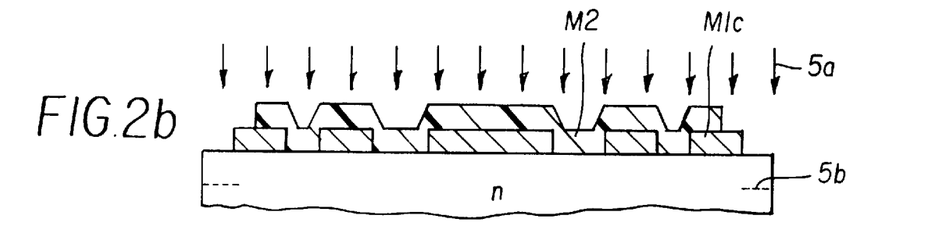

Subsequently, a $SiO_2$ film 2 is deposited on the first mask M1 of the polysilicon film 1 by thermal CVD, and patterned by photolithography, to provide a second mask M2, and ions, such as boron (B) ions 5a, that provide p-type impurities are implanted into a region that is defined by the first and second masks M1, M2, as shown in FIG. 2(b), in which 5b denotes boron (B) atoms thus implanted. This implantation of the boron ions 5a for forming the $p^+$ contact region 22a is carried out with an accelerating-field voltage of 30, 100, 300, 900 keV and a dose amount of about $5 \times 10^{15}$ $cm^{-2}$. The temperature is controlled to about 800° C. during ion implantation. By implanting the ions at such a high temperature, the ion activation rate can be improved. The second mask M2 is not necessarily formed from a $SiO_2$ film, but must be formed from a material that is different from the first mask M1 and permits selective etching, since the second mask M2 will be removed while leaving the first mask M1 in a later step. Where the first mask M1 is formed from a polysilicon film, for example, the second mask M2 may be formed from a $SiO_2$ film as in this embodiment, so that only the second mask M2 can be removed by hydrofluoric acid. To the contrary, if the first mask M1 is formed from a $SiO_2$ film and the second mask M2 is formed from a polysilicon film, only the polysilicon film may be etched by reactive ion etching (that will be referred to as RIE) using mixed gases of carbon tetrachloride and oxygen, while controlling the etching rates of the $SiO_2$ film and polysilicon film. Thus, the material of the second mask M2 is selected so that only the second mask M2 is selectively removed while leaving the first mask M1. The second mask M2 can be easily positioned since its edge is only required to be located on the first mask M1. The p-type impurities may be selected from aluminum (Al) and other elements, in addition to boron (B).

Figure 2C:
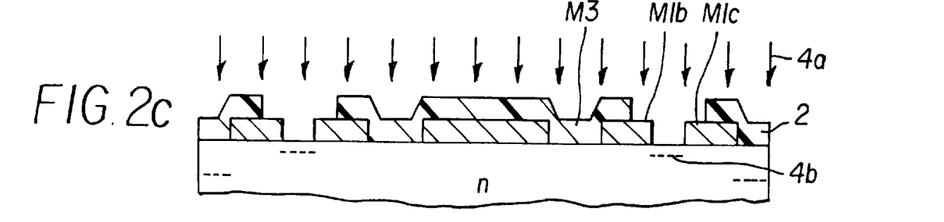

After removing the second mask M2 in the form of $SiO_2$ film, an $SiO_2$ film 2 is deposited again by thermal CVD, and patterned by photolithography, to provide a third mask M3, and ions that provide n-type impurities, such as nitrogen (N) ions 4a, are implanted into a region that is defined by the first and third masks M1, M3, as shown in FIG. 2(c), in which 4b denote nitrogen atoms thus implanted. The nitrogen ions 4a are implanted with an accelerating-field voltage of 100 keV and a dose amount of about $5 \times 10^{15}$ $cm^{-2}$, so as to form the $n^+$ source region 23. In this case, too, the third mask M3 does not necessarily formed from an $SiO_2$ film, but may be formed of any material provided that only the third mask M3 can be selectively removed while leaving the first mask M1 in a later step. The third mask M3 can be easily positioned relative to the semiconductor substrate since its edge is only required to be located on the first mask M1. The n-type impurities may be selected from phosphorous (P) and other elements, in addition to nitrogen (N).

Figure 2D:
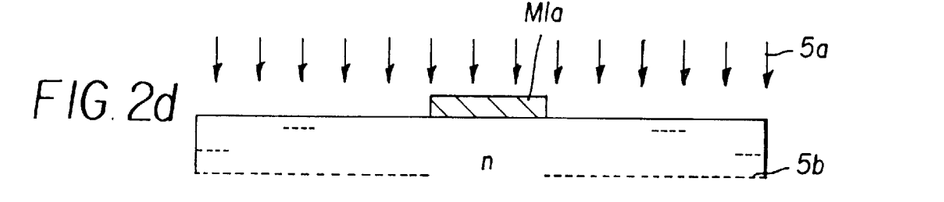

Subsequently, the third mask M3 in the form of $SiO_2$ film is removed and the side portions M1b, M1c of the first mask are also removed by photolithography, while leaving only the center portion M1a of the first mask on the substrate, as shown in FIG. 2(d). Using the remaining portion M1a of the first mask as a mask, boron (B) ions 5a are implanted again with an accelerating-field voltage of 800 keV and a dose amount of about $1 \times 10^{15}$ $cm^{-2}$, so as to form the $p^+$ embedded region 22. An increased accelerating-field voltage is employed so as to form a deep impurity region. The p-type impurities may be selected from aluminum (Al) and other elements, in addition to boron (B).

Figure 2E:
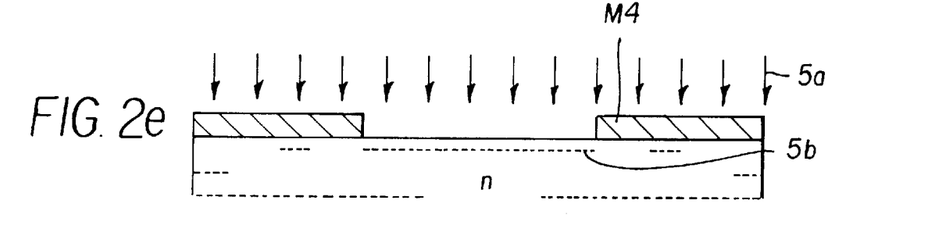

After the remaining portion M1a of the first mask is removed, a polysilicon film is deposited on the substrate surface, and patterned by photolithography, so as to provide a fourth mask M4, and ions, such as boron (B) ions 5a, that provide p-type impurities are implanted into a region that is defined by the fourth mask M4, as shown in FIG. 2(e), in which 5b denotes boron atoms thus implanted. The boron ions 5a are implanted with an accelerating-field voltage of 100 keV and a dose amount of about $5 \times 10^{15}$ $cm^{-2}$, so as to form the p gate region 24. In this case, the fourth mask M4 does not necessarily formed from a polysilicon film, but may be formed of CVD $SiO_2$ film. The fourth mask M4 need not be highly accurately or strictly positioned relative to the $n^+$ source region 23. The p-type impurities may be selected from aluminum (Al) and other elements, in addition to boron (B).

Figure 2F:
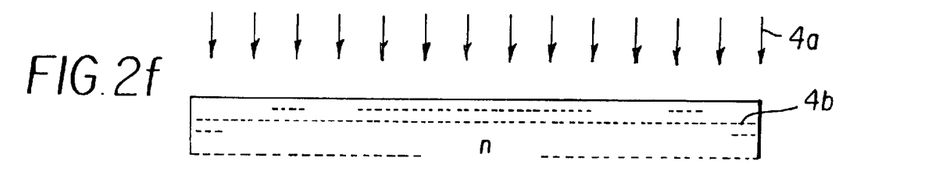

In the next step, the fourth mask M4 is removed, and nitrogen (N) ions 4a are implanted over the entire surface of the semiconductor substrate, as shown in FIG. 2(f), in which 4b denote nitrogen (N) atoms thus implanted. The nitrogen ions 4a are implanted with an accelerating-field voltage of 200 keV and a dose amount of about $1 \times 10^{12}$ $cm^{-2}$, so as to control the concentration of the n channel region 30. Since the boron ions were implanted to a large depth so as to form the $p^+$ embedded region 22 in the step of FIG. 2(d), a certain amount of boron atoms are present in the portion of the n drift layer 21b that is located above the $p^+$ embedded region 22 to provide the n channel region 30. By implanting the nitrogen (N) ions as described above, the resistivity of the surface layer can be stabilized. The impurity concentration of the surface layer after heat treatment is about $5 \times 10^{15}$ $cm^{-3}$.

Figure 3A:
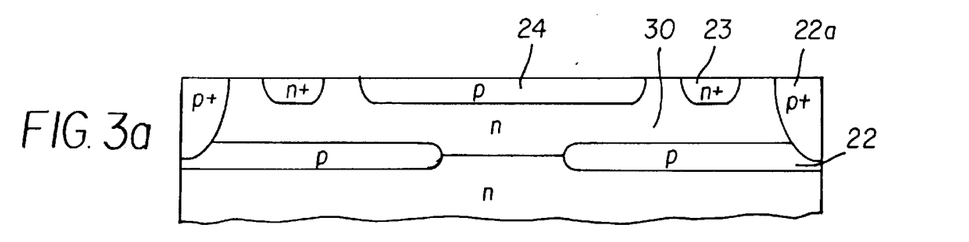

By conducting heat treatment at 1600° C. for two hours so as to activate the implanted impurities, the $n^+$ source region 23, p gate region 24, $p^+$ embedded region 22 and the $p^+$ contact region 22a are respectively formed as shown in FIG. 3(a). Although diffusion of the impurities is unlikely to occur in the SiC substrate as discussed above, the depth of the impurity regions can be controlled by suitably adjusting the accelerating-field voltage. To produce the $p^+$ embedded region 22, for example, the accelerating-field voltage is increased to 800 keV, so that a 0.3 μm-thickness layer is formed at around a depth of 0.8 μm, and an about 0.6 μm-thickness n drift region 21b remains on the $p^+$ embedded region 22. The depth of the p gate region 24 and the $n^+$ source region 23 is about 0.2 μm.

Figure 3B:
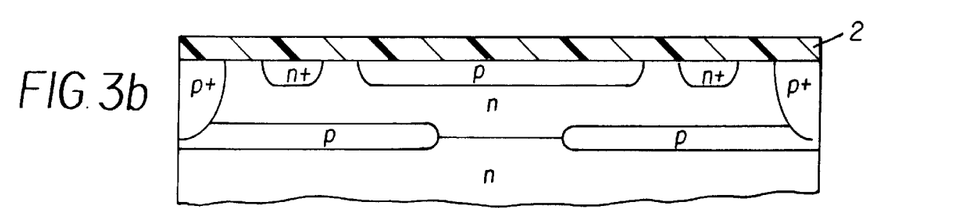
Figure 3C:
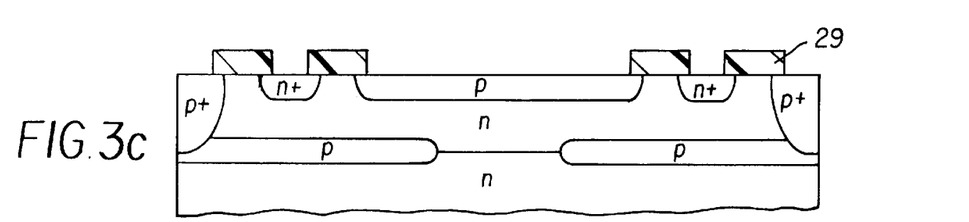

Subsequently, a $SiO_2$ film 2 is deposited by CVD on the surface of the SiC substrate, as shown in FIG. 3(b). A fifth mask M5 is then formed by photolithography, and openings or contact holes are formed through the $SiO_2$ film 2 by wet etching using hydrofluoric acid, as shown in FIG. 3(c).

Figure 3D:
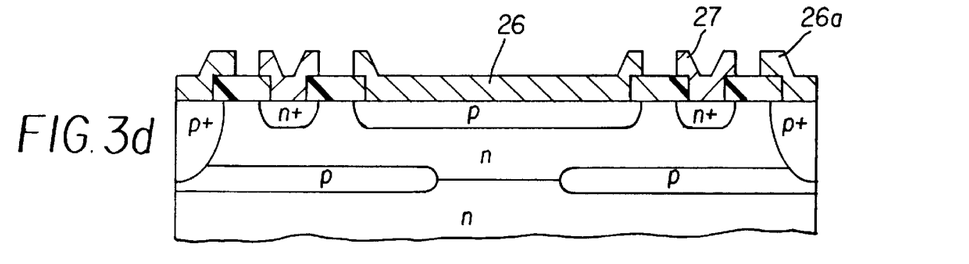

An aluminum alloy film is then formed by vapor deposition, and patterned, so as to provide source electrode 27, gate electrode 26, and contact electrode 26a, as shown in FIG. 3(d). A drain electrode is also provided on the rear surface of the $n^+$ substrate, and the manufacturing process is completed.

By employing the manufacturing method as described above, the high-voltage SiC vertical JFET as shown in FIG. 1 can be produced.

In the known JFET of FIG. 9, the source electrode 17 is in contact with both the n$^+$ source region 13 and the p$^+$ contact region 12a, such that the p$^+$ embedded region 12 has the same potential as the source electrode 17. With this arrangement, when a positive voltage is applied to the gate electrode 17, a depletion layer spreads out only from the p gate region 14, and therefore the n channel region 30 is not pinched off quickly.

On the other hand, the JFET of FIG. 1 is characterized in that the contact electrode 26a on the p$^+$ contact region 22a is not short-circuited to the source electrode 27 but to the gate electrode 26. With this arrangement, the potential of the p$^+$ embedded region 22 is kept equal to that of the gate electrode 27. When a negative voltage is applied to the gate electrode 26, therefore, the p gate region 24 and the p$^+$ contact region 22a both function as a gate, and depletion layers spread out from both the upper and lower sides of the n channel region 30, so as to pinch off the channel region 30 with a high efficiency. This means that the current between the source and drain changes to a great extent with a small gate voltage, thus assuring a large gain with respect to gate voltage.

Furthermore, the p gate region 14 and p$^+$ embedded region 12 may have difference potentials in the known structure, and in this case, a parasitic transistor latches up, causing current to flow from the p$^+$ embedded region 12 to the p gate region 14 when a negative bias is applied to the gate electrode 16. Once this phenomenon occurs, current through the n channel region 30 can no longer be controlled as desired.

With the JFET constructed according to the present invention, on the other hand, the p gate region 24 and the p$^+$ embedded region 22 have the same potential, and no parasitic transistor latches up, with no current flowing between these regions 22, 24. Thus, the present JFET does not suffer from the problem encountered in the JFET of FIG. 9.

In the method for manufacturing the JFET as described above, the n$^+$ source region 23 is defined by one edge of the portion M1b of the first mask. Furthermore, the inner periphery of the p$^+$ embedded region 22 is defined by the edge of the portion M1a of the first mask. Thus, the impurity regions are defined only by means of the first mask M1, and suitably positioned relative to each other, causing no problem of non-uniformity due to variations in position that would occur if the regions were defined by a plurality of masks. Another advantage is that the dimensions of the respective impurity regions can be confirmed after the pattern of the first mask M1 is formed.

The length of the channel region is a main parameter based on which the characteristics of the JFET are determined, and therefore it is extremely important in terms of its application to control the channel length with sufficiently high accuracy. In the SiC JFET of the first embodiment, the length of the n channel region 30 located under the p gate region 24, which is substantially equal to the channel length, can be made uniform and sufficiently small, thus assuring stable characteristics of the JFET and high yield in the manufacture thereof. For example, the ON resistance of a 1500V-class JFET fabricated according to the present embodiment was as low as 15 mΩ·cm$^{-2}$.

Furthermore, since the p$^+$ embedded region 22 is formed by implanting ions at a high accelerating-field voltage so as to achieve a large junction depth, the resulting JFET easily realizes a breakdown voltage of 1500V or higher.

By implanting nitrogen (N) ions into the n drift layer above the p$^+$ embedded region 22 to form the n channel region 30, the threshold voltage of the JFET can be controlled as desired, to thus provide a normally-off type FET depending upon the conditions.

The above manufacturing method may be modified in several ways. For example, the order of ion implantation for forming the n$^+$ source region 23 and the p gate region 24 may be reversed. Also, the ion implantation for controlling the impurity concentration of the n channel region 30 may be initially conducted. Since subtle positioning of masks is not required in forming the p$^+$ contact region 22a, the ion implantation for forming the region 22a may be conducted without using the mask M1. If the ion implantation is conducted at a temperature lower than 1000° C., the masks may be selected from a wider range of materials.

In another method for fabricating the JFET of FIG. 1, impurities are introduced into a surface layer of the n drift layer 21b after it is formed by epitaxial growth, and then the n channel region 30 is additionally formed on the surface layer by epitaxial growth.

Second Embodiment

Figure 4:
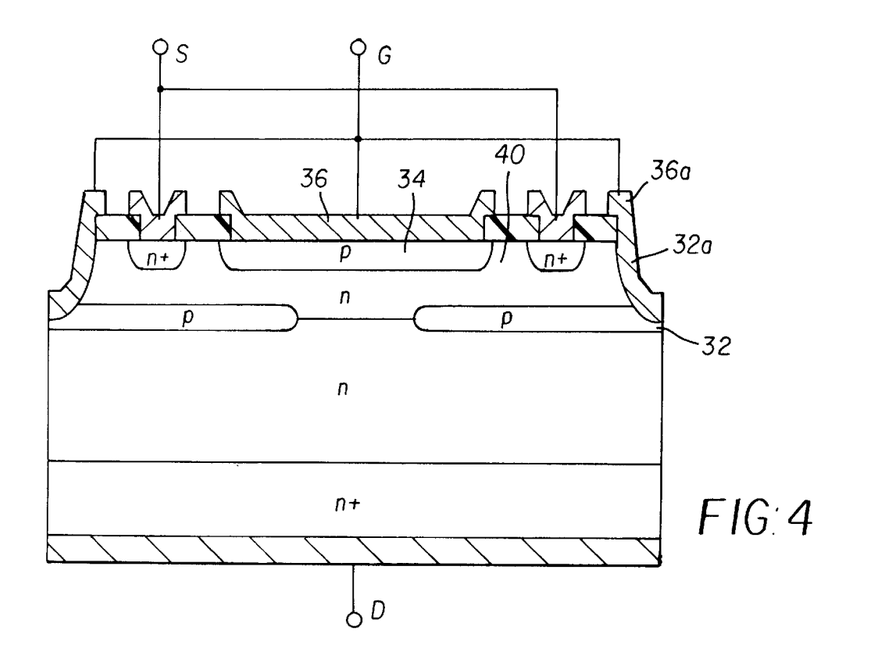
FIG. 4 is a cross-sectional view showing a JFET according to the second embodiment of the present invention.

FIG. 4 is a cross-sectional view of a SiC JFET according to the second embodiment of the present invention, which is a modified example of the first embodiment of FIG. 1.

In this embodiment, no p$^+$ contact region is formed which reaches a p$^+$ embedded region 32, but a recessed portion 32a formed in the surface of the SiC substrate receives a contact electrode 36a that contacts with the p$^+$ embedded region 32. The contact electrode 36a is short-circuited to the gate electrode 36.

As a method for forming the recessed portion 32a, a pattern of a resist and an oxide film is formed by photolithography after the step of FIG. 3(b), and the recessed portion 32a is formed by reactive ion etching (RIE) with mixed gases of carbon tetrachloride (CF$_4$) and oxygen (O$_2$), using the pattern as a mask.

In this embodiment, too, the potential of the p$^+$ embedded region 32 is kept equal to that of the gate electrode 36. In operation, the p gate region 34 and the p$^+$ contact region 32a both function as a gate, and depletion layers spread out from both the upper and lower sides into the n channel region 40, so as to quickly pinch off the channel region 40 with a small gate voltage. Also, since the p gate region 34 and the p$^+$ embedded region 32 have the same potential, no parasitic transistor latches up, and no current flows between these regions 32, 34, thus making it possible to suitably control current through the n channel region 40.

The fabrication of the JFET of the second embodiment does not require ion implantation for forming a deep p$^+$ contact region. The structure of the present embodiment may also be applied to the following embodiments.

Third Embodiment

Figure 5:
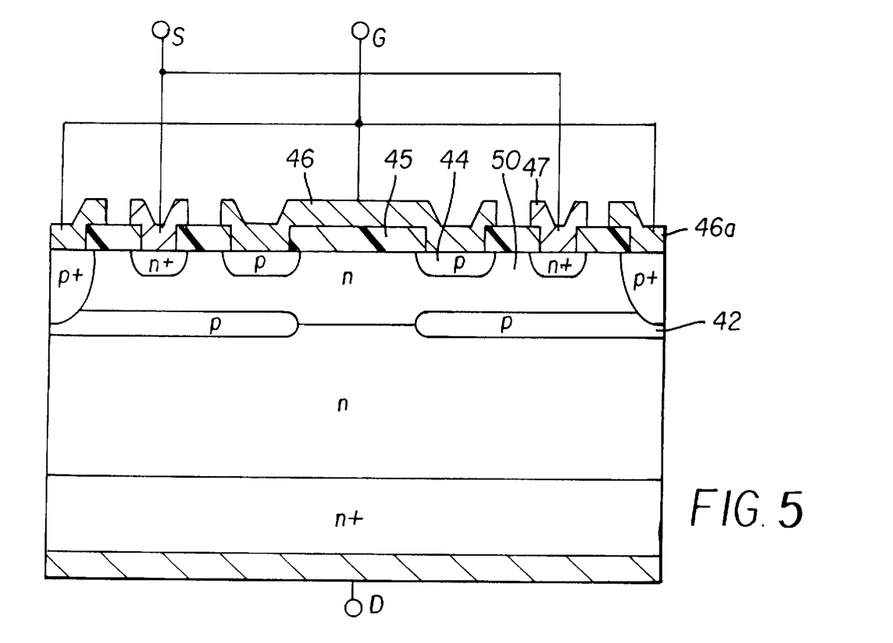
FIG. 5 is a cross-sectional view showing a JFET according to the third embodiment of the present invention.

FIG. 5 is a cross-sectional view of a part of a SiC JFET according to the third embodiment of the present invention.

In the present embodiment, p gate regions 44 of adjacent cells that contact with a gate electrode 46 are separated or spaced from each other, and no p gate region is formed above a portion of the n drift layer where a p$^+$ embedded region 42 is not formed. Between the p gate regions 44, the gate electrode 46 is formed on an oxide film 45 over the surface of an n channel region 50. As in the previous embodiments, a contact electrode 46a is isolated from a source electrode 47, and is short-circuited to the gate electrode 46, thus permitting fast switching operations.

When a negative voltage is applied to the gate electrode, an accumulation layer in which carriers are accumulated appears in a surface layer of the n channel region 40 located right under the gate oxide film 45, so that the ON resistance can be advantageously reduced.

Fourth Embodiment

Figure 6:
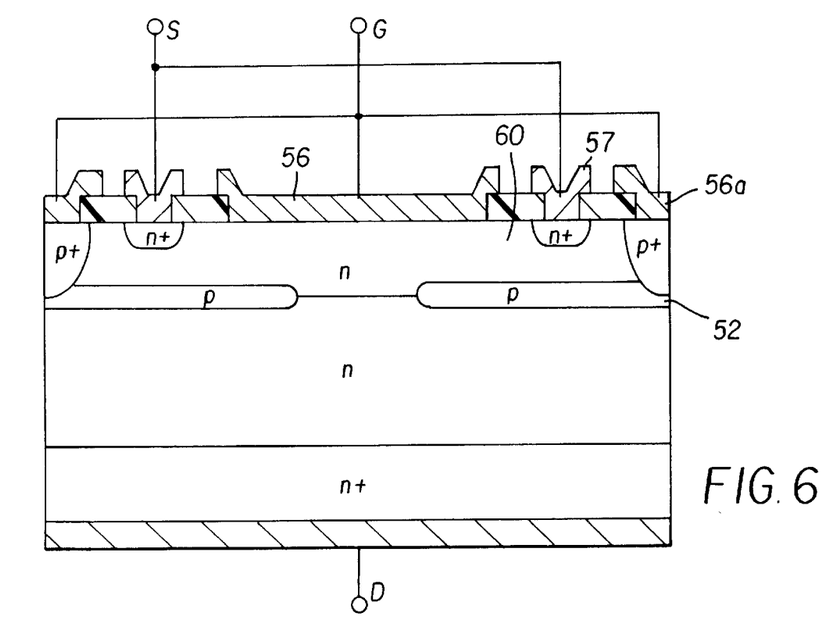
FIG. 6 is a cross-sectional view showing a MESFET according to the fourth embodiment of the present invention.

FIG. 6 is a cross-sectional view showing a part of a SiC MESFET according to the fourth embodiment of the present invention.

The SiC MESFET of the present embodiment is different from the SiC JFET of FIG. 1 in that a gate electrode 56 is in contact with the top surface of an n channel region 60. Here, the gate electrode 56 is formed of a material selected from metals, such as Ti, Al and Pt, which form a Schottky junction with the n channel region 60.

A contact electrode 56a is isolated from a source electrode 57, and is short-circuited to the gate electrode 56, as in the previous embodiments. When a negative voltage is applied to the gate electrode 56, depletion layers spread out from the gate electrode 56 and the p+ embedded region 52 into the n channel region 60, so as to pinch off the n channel region 60 with a small gate voltage. In this example, too, no parasitic transistor appears which would otherwise make it impossible to control current through the n channel region 60.

The gate electrode 56 is formed of such a metal that forms a Schottky junction with the SiC substrate, and the gate and source electrodes 56, 57 are not necessarily formed of the same metal. The gate electrode 56 may consist of two metal layers one of which is in contact with the SiC substrate to provide a Schottky junction, and the other is formed of the same metal as the source electrode 57. The process for manufacturing the SiC MESFET can be easily derived from those of the illustrated examples, and therefore will not be described herein.

Fifth Embodiment

Figure 7:
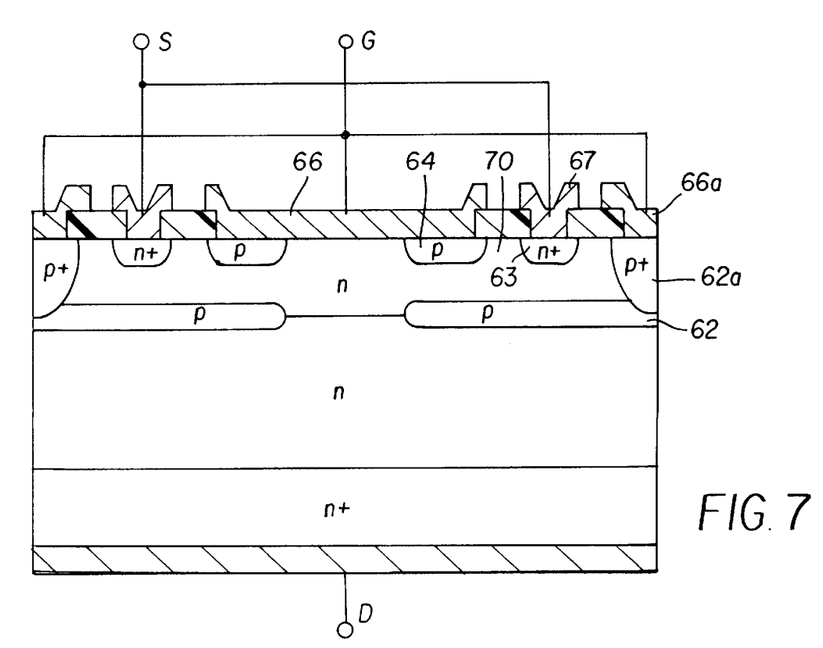
FIG. 7 is a cross-sectional view showing a MESFET according to the fifth embodiment of the present invention.

FIG. 7 is a cross-sectional view showing a part of a SiC JFET according to the fifth embodiment of the present invention.

In this example, p gate regions 64 of adjacent cells that are in contact with a gate electrode 66 are separated or spaced from each other, and no p gate region is formed above a portion of the n drift layer where a p+ embedded region 62 is not formed. Between the p gate regions 64, the gate electrode 66 is formed in contact with the surface of an n channel region 70. The gate electrode 66 is made of a metal that forms a Schottky junction with the n channel region 70. As in the previous embodiments, a contact electrode 66a is isolated from a source electrode 67, and is short-circuited to the gate electrode 66, thus permitting fast switching actions.

In the JFET of the third embodiment of FIG. 5, the gate electrode 46 is in contact only with the p gate region 44 at the surface of the SiC substrate. To reduce the contact resistance between the gate electrode 46 and the p gate region 44, the contact area must be increased, but the size of a contact hole that allows contact between the electrode 46 and the p gate region 44 cannot be increased so much since it limits the minimum length of the channel.

The JFET of the present embodiment is an improvement in this respect, wherein the gate electrode 56 is in contact with the surface of the n channel region 60 as well as the p gate region 54. With this arrangement, a sufficiently large area of contact can be provided, and the channel region may be designed to be narrowed as desired.

The JFET of the fourth embodiment of FIG. 6 may be modified by providing p gate regions 64 at end portions of the Schottky junction, so as to increase the breakdown voltage.

In the JFET of the fifth embodiment, too, the n+ source region 63 and p+ embedded region 62 are formed through self alignment thereof, so that the channel can be formed with high uniformity and accuracy, as in the JFET of the first embodiment, thus assuring stable characteristics and high yield.

Sixth Embodiment

Figure 8:
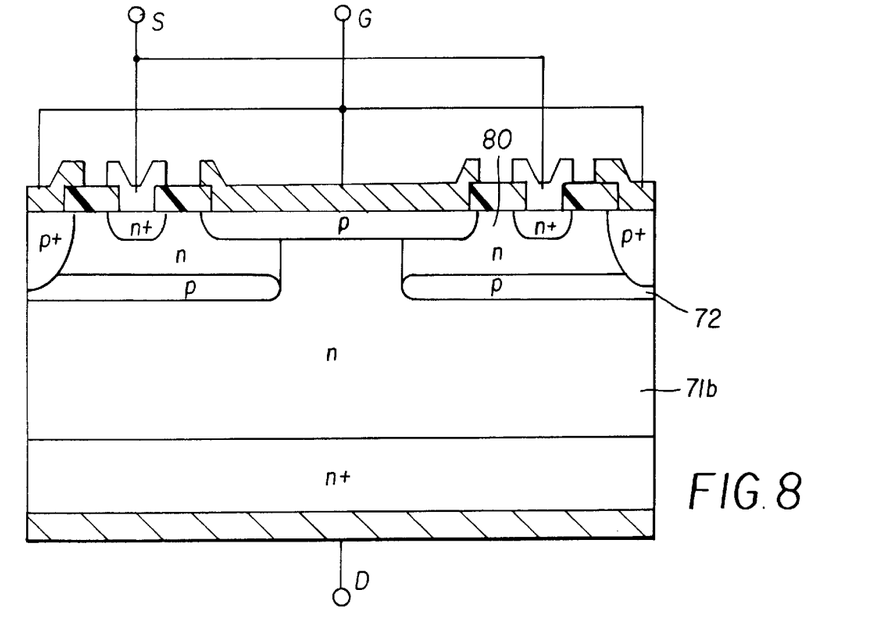
FIG. 8 is a cross-sectional view showing a JFET according to the sixth embodiment of the present invention.

FIG. 8 is a cross-sectional view showing a part of a SiC JFET according to the sixth embodiment of the present invention, which is similar to the first embodiment of FIG. 1.

While the n channel region 60 is formed by doping the entire area of the SiC substrate (n drift layer 21b) with n-type impurities in the first embodiment, an n channel region 80 of the present embodiment is formed only in a selected portion of the n drift layer 71b that is located above the p+ embedded region 72.

If the entire area of the SiC substrate is subjected to doping for forming the channel as in the embodiment of FIG. 1, depletion layers do not sufficiently spread out from pn junctions in the vicinity of ends of the p+ embedded regions 22, which may result in reduced breakdown voltage.

To avoid the above problem, only the portion of the SiC substrate located above the p+ embedded region 72 is doped with n-type impurities so as to provide the n channel region 80 in the present embodiment. As a result, a depletion layer normally spreads between the p+ embedded region 72 and the n drift layer 71b, thus avoiding reduction in the breakdown voltage.

The n channel region 80 of the SiC JFET of the sixth embodiment may be formed by implanting nitrogen (N) ions after the step of FIG. 2(e) without removing the mask M1a. Thus, the formation of the n channel region 80 can be accomplished without increasing the number of process steps.

The above-described structure with selectively doped regions may also employed in the JFETs and MESFETs of the second through fifth embodiments.

In the silicon carbide vertical FET of the present invention as described above, the electrodes are provided independently of each other on the first conductivity type source region and the second conductivity type embedded region, and the potential of the second conductivity type embedded region is made equal to that of the gate electrode, thus assuring significantly improved switching characteristics, such as the gain of gate voltage.

In a method for manufacturing the vertical FET, the first mask and the second mask that overlaps the first mask are used for defining first conductivity type and second conductivity type impurity regions. More specifically, a first conductivity type impurity region may be defined by one of opposite edges of the first mask, and a second conductivity type impurity region may be defined by a portion of the first mask after removing the second mask and another portion of the first mask. If the first conductivity type source region and second conductivity type embedded region, for example, are formed by this method, these regions can be formed through self alignment.

Furthermore, the impurity concentration of the first conductivity type channel region is selectively controlled so as to avoid reduction in the breakdown voltage.

Thus, the present invention makes it possible to provide JFET and MOSFET having precisely dimensioned channel regions, which were conventionally difficult to produce, and is also effective to reduce the ON resistance.

The present invention is not limited to individual FETs as described above, but may also be applied to CMOS-IC and other SiC semiconductor devices. Also, the present invention makes it easy to manufacture silicon carbide semiconductor devices having high breakdown voltage.

What is claimed is:

1. A silicon carbide vertical FET, comprising:
    a first conductivity type silicon carbide drain layer;
    a first conductivity type drift layer comprising silicon carbide, which is laminated on the first conductivity type silicon carbide drain layer;
    a second conductivity type gate region and a first conductivity type source region that are formed in selected portions of a surface layer of the first conductivity type drift layer, such that the gate region and the source region are spaced from each other;
    a second conductivity type embedded region formed in a selected portion of the first conductivity type drift layer below the second conductivity type gate region and the first conductivity type source region, such that the embedded region is not connected to the gate region and the source region;
    a gate electrode formed in contact with a surface of the second conductivity type gate region;
    a source electrode formed in contact with a surface of the first conductivity type source region;
    a drain electrode formed on a rear surface of the first conductivity type drain layer; and
    a means for electrically connecting the second conductivity type embedded region and the gate electrode,
    wherein said second conductivity type embedded region has the same potential as said gate electrode.

2. A silicon carbide vertical FET according to claim 1, wherein the means for electrically connecting comprises:
    a second conductivity type contact region that extends from a surface of the first conductivity type drift layer to reach the second conductivity type embedded region; and
    a contact electrode that is in contact with a surface of the second conductivity type contact region and is connected to the gate electrode.

3. A silicon carbide vertical FET according to claim 1, wherein the means for electrically connecting comprises:
    a recess formed in the first conductivity type drift layer such that the recess extends from a surface of the first conductivity type drift layer to reach the second conductivity type embedded region; and
    an embedded electrode that is received in the recess and is in contact with an exposed surface of the second conductivity type embedded region, said embedded electrode being connected to the gate electrode.

4. A silicon carbide vertical FET according to any one of claims 1–3, wherein the second conductivity type gate region is formed in a surface layer of the first conductivity type drift layer that is located above a portion where the second conductivity type embedded region is not formed.

5. A silicon carbide vertical FET according to any one of claims 1–3, wherein the gate electrode is formed on a gate insulating film over a surface layer of the first conductivity type drift layer that is located above a portion where the second conductivity type embedded region is not formed.

6. A silicon carbide vertical FET according to any one of claims 1–3, further comprising a metal film that forms a Schottky junction with the first conductivity type drift layer, said metal film being formed on a surface of the first conductivity type drift layer that is located above a portion where the second conductivity type embedded region is not formed.

7. A silicon carbide vertical FET, comprising:
    a first conductivity type silicon carbide drain layer;
    a first conductivity type drift layer comprising silicon carbide, which is laminated on the first conductivity type silicon carbide drain layer;
    a first conductivity type source region that is formed in a selected portion of a surface layer of the first conductivity type drift layer;
    a second conductivity type embedded region formed in a selected portion of the first conductivity type drift layer below the first conductivity type source region, such that the embedded region is not connected to the source region;
    a gate electrode formed in contact with a surface of the first conductivity type drift layer, said gate electrode forming a Schottky junction with the drift layer;
    a source electrode formed in contact with the first conductivity type source region;
    a drain electrode formed on a rear surface of the first conductivity type drain layer; and
    a means for electrically connecting the second conductivity type embedded region and the gate electrode,
    wherein said second conductivity type embedded region has the same potential as said gate electrode.

8. A silicon carbide vertical FET according to claim 7, wherein the means for electrically connecting comprises:
    a second conductivity type contact region that extends from a surface of the first conductivity type drift layer to reach the second conductivity type embedded region; and
    a contact electrode that is in contact with a surface of the second conductivity type contact region and is connected to the gate electrode.

9. A silicon carbide vertical FET according to claim 7, wherein the means for electrically connecting comprises:
    a recess formed in the first conductivity type drift layer such that the recess extends from a surface of the first conductivity type drift layer to reach the second conductivity type embedded region, said silicon carbide vertical FET further comprising an embedded electrode that is received in the recess and is in contact with an exposed surface of the second conductivity type embedded region, said embedded electrode being connected to said gate electrode.

10. A silicon carbide vertical FET according to any one of claims 1–3 or 7–9, further comprising a first conductivity type channel region formed in a surface layer of the first conductivity type drift layer, said first conductivity type channel region having a higher impurity concentration than the first conductivity type drift layer.

11. A silicon carbide vertical FET, comprising:
    a first conductivity type silicon carbide drain layer;
    a first conductivity type drift layer comprising silicon carbide, which is laminated on said first conductivity type silicon carbide drain layer;

a second conductivity type gate region and a first conductivity type source region that are formed in selected portions of a surface layer of the first conductivity type drift layer, such that the gate region and the source region are spaced from each other;

a first conductivity type channel region formed in the surface layer of the first conductivity type drift layer, said first conductivity type channel region having a higher impurity concentration than the first conductivity type drift layer;

a second conductivity type embedded region formed in a selected portion of the first conductivity type drift layer below the second conductivity type gate region and the first conductivity type source region, such that the embedded region is not connected to the gate region and the source region;

a gate electrode formed in contact with a surface of the second conductivity type gate region;

a source electrode formed in contact with a surface of the first conductivity type source region;

a drain electrode formed on a rear surface of the first conductivity type drain layer; and a means for electrically connecting the second conductivity type embedded region and the gate electrode, wherein said first conductivity type channel region is formed in a selected portion of the first conductivity type drift layer.

12. A silicon carbide vertical FET according to claim 11, wherein the first conductivity type channel region is present only above the second conductivity type embedded region.

* * * * *